(12) United States Patent
Park et al.

(10) Patent No.: US 11,225,715 B2
(45) Date of Patent: Jan. 18, 2022

(54) SHOWERHEAD, SEMICONDUCTOR MANUFACTURING APPARATUS INCLUDING THE SAME, AND SEMICONDUCTOR MANUFACTURING METHOD

(71) Applicant: SAMSUNG ELECTRONICS CO., LTD., Suwon-si (KR)

(72) Inventors: Byung-Sun Park, Suwon-si (KR); Ik Soo Kim, Yongin-si (KR); Jiwoon Im, Hwaseong-si (KR); Sangho Rha, Seongnam-si (KR); Minjae Oh, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 29 days.

(21) Appl. No.: 16/750,557

(22) Filed: Jan. 23, 2020

(65) Prior Publication Data

US 2020/0325579 A1 Oct. 15, 2020

(30) Foreign Application Priority Data

Apr. 11, 2019 (KR) .................. 10-2019-0042678
Aug. 2, 2019 (KR) .................. 10-2019-0094356

(51) Int. Cl.
*C23C 16/455* (2006.01)
*H01L 21/67* (2006.01)
*H01J 37/32* (2006.01)

(52) U.S. Cl.
CPC .... *C23C 16/45565* (2013.01); *H01J 37/3244* (2013.01); *H01L 21/67288* (2013.01)

(58) Field of Classification Search
CPC . C23C 16/04; C23C 16/45565; C23C 16/345; H01L 21/6719; H01L 21/67288; H01J 37/324; H01J 37/32935
See application file for complete search history.

(56) References Cited

U.S. PATENT DOCUMENTS

| | | | |
|---|---|---|---|
| 10,041,172 B2 | 8/2018 | Kim et al. | |
| 2008/0173735 A1* | 7/2008 | Mitrovic | C23C 16/45574 239/548 |
| 2008/0196666 A1 | 8/2008 | Toshima | |
| 2010/0310771 A1* | 12/2010 | Lee | C23C 16/45551 427/255.28 |
| 2018/0002808 A1 | 1/2018 | Chung et al. | |
| 2019/0013225 A1* | 1/2019 | Taguchi | G01B 11/306 |
| 2019/0062918 A1* | 2/2019 | Shaikh | H01L 21/68771 |

FOREIGN PATENT DOCUMENTS

| | | |
|---|---|---|
| KR | 10-2008-0035735 A | 4/2008 |
| KR | 10-1635085 B1 | 7/2016 |
| KR | 10-1929481 B1 | 12/2018 |

\* cited by examiner

*Primary Examiner* — Yuechuan Yu
(74) *Attorney, Agent, or Firm* — Lee IP Law, PC (57) ABSTRACT

A semiconductor manufacturing apparatus includes a chamber that includes a station in which a substrate is provided, a substrate holder that is in the station and receives the substrate, and lower showerheads below the substrate holder, the lower showerheads including an isotropic showerhead having first nozzle holes that isotropically provide a first reaction gas on a bottom surface of the substrate, and a striped showerhead having striped nozzle regions and striped blank regions between the striped nozzle regions, the striped nozzle regions having second nozzle holes that non-isotropically provide a second reaction gas on the bottom surface of the substrate.

15 Claims, 14 Drawing Sheets

SHOWERHEAD, SEMICONDUCTOR MANUFACTURING APPARATUS INCLUDING THE SAME, AND SEMICONDUCTOR MANUFACTURING METHOD

CROSS-REFERENCE TO RELATED APPLICATION

Korean Patent Application Nos. 10-2019-0042678, filed on Apr. 11, 2019, and 10-2019-0094356, filed on Aug. 2, 2019 in the Korean Intellectual Property Office, and entitled: "Showerhead, Semiconductor Manufacturing Apparatus Including the Same, and Semiconductor Manufacturing Method," are incorporated by reference herein in their entirety.

BACKGROUND

1. Field

Embodiments relate to a showerhead, a semiconductor manufacturing apparatus including the same, and a semiconductor manufacturing method.

2. Description of the Related Art

In general, a semiconductor device is manufactured by employing a plurality of unit processes. The unit processes may include a film deposition process, a photolithography process, and an etching process. Plasma may be mainly used to perform deposition and etching processes. The plasma may treat substrates under high temperature condition. A radio frequency power is generally used to produce the plasma.

SUMMARY

Embodiments are directed to a semiconductor manufacturing apparatus, including a chamber that includes a station in which a substrate is provided, a substrate holder that is in the station and receives the substrate, and lower showerheads below the substrate holder, the lower showerheads including an isotropic showerhead having first nozzle holes that isotropically provide a first reaction gas on a bottom surface of the substrate, and a striped showerhead having striped nozzle regions and striped blank regions between the striped nozzle regions, the striped nozzle regions having second nozzle holes that non-isotropically provide a second reaction gas on the bottom surface of the substrate.

Embodiments are also directed to a showerhead, including a nozzle plate, the nozzle plate including striped nozzle regions having nozzle holes, and a striped blank region that is between the striped nozzle regions and has a shape similar to a shape of the striped nozzle regions, and a cover housing on the nozzle plate.

Embodiments are also directed to a semiconductor manufacturing method, including forming an upper pattern on a top surface of a substrate, using a striped showerhead to form a lower striped pattern on a bottom surface of the substrate, the striped showerhead including striped nozzle regions and a striped blank region between the striped nozzle regions, and using an isotropic showerhead to form a planar layer on the lower striped pattern and the bottom surface of the substrate.

Embodiments are also directed to a semiconductor manufacturing apparatus, including a chamber, a substrate holder that is in the chamber and receives a substrate, a lower showerhead that is below the substrate holder and includes first striped nozzle regions, and an upper showerhead that is above the substrate holder and includes second striped nozzle regions that are the same as the first striped nozzle regions.

BRIEF DESCRIPTION OF THE DRAWINGS

Features will become apparent to those of skill in the art by describing in detail example embodiments with reference to the attached drawings in which.

DETAILED DESCRIPTION

Figure 1:
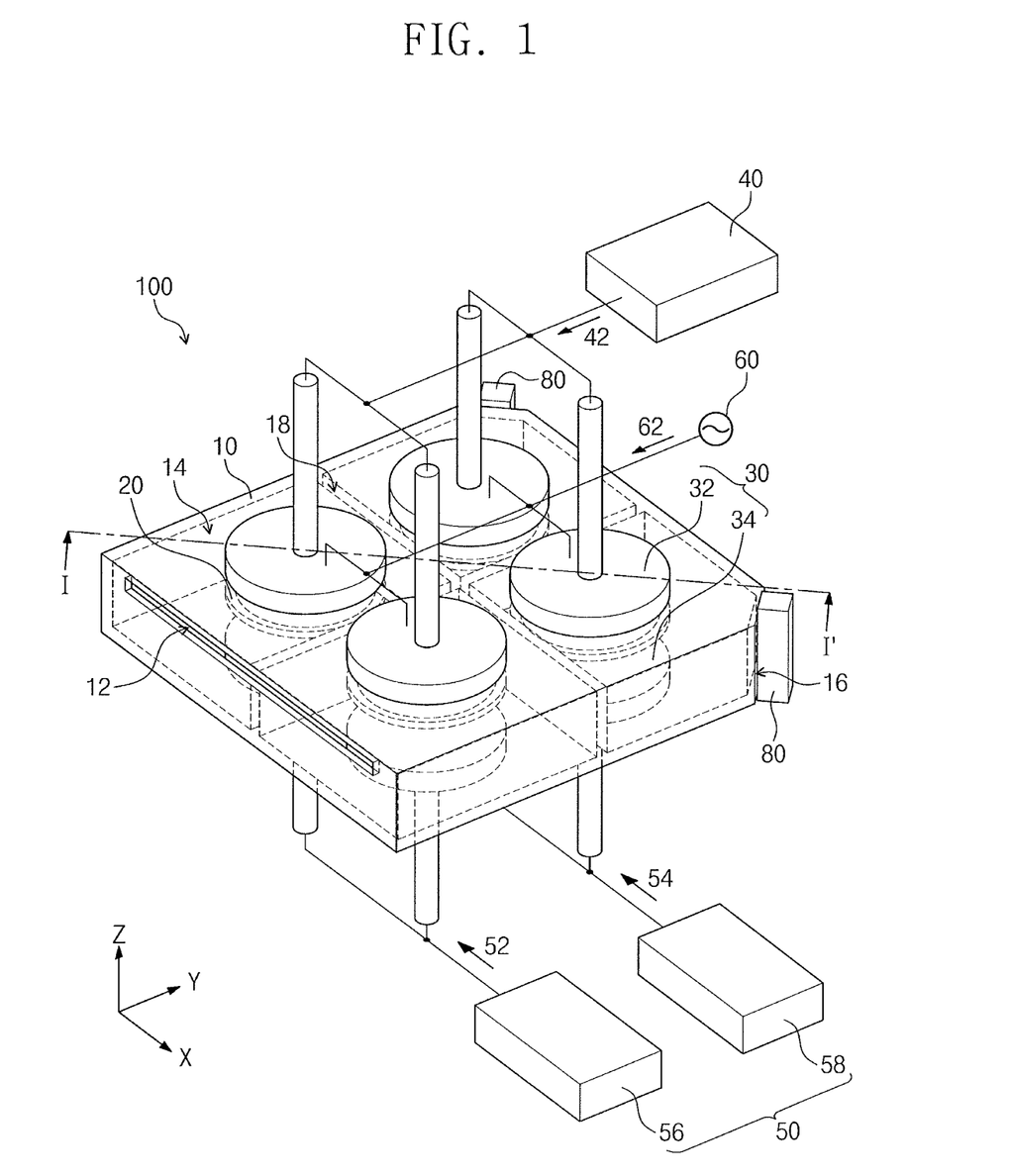
FIG. 1 illustrates a perspective view of a semiconductor manufacturing apparatus according to an example embodiment.
Figure 2:
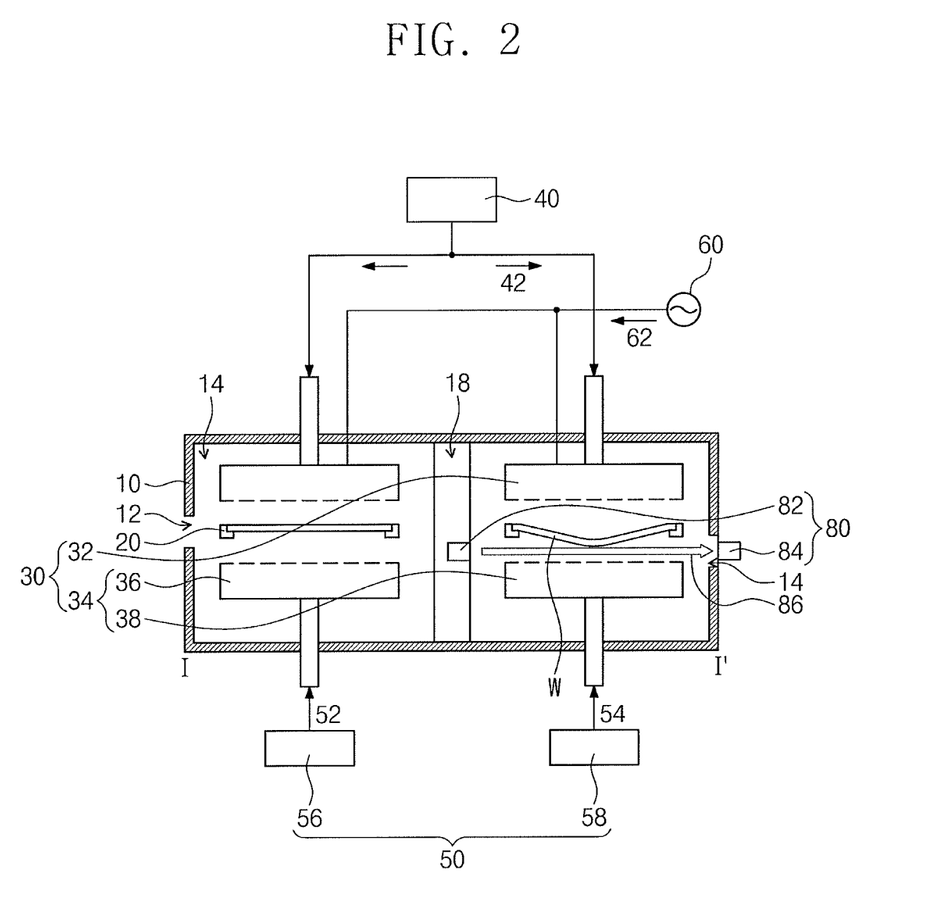
FIG. 2 illustrates a cross-sectional view taken along line I-I' of FIG. 1.

FIG. 1 shows a semiconductor manufacturing apparatus 100 according to an example embodiment. FIG. 2 shows a cross-sectional view taken along line I-I' of FIG. 1.

Referring to FIGS. 1 and 2, the semiconductor manufacturing apparatus 100 may be a chemical vapor deposition (CVD) apparatus. The semiconductor manufacturing apparatus 100 may include, for example, a chamber 10, one or more substrate holders 20, and one or more showerheads 30.

The chamber 10 may provide a space for isolating a substrate W from the outside. The chamber 10 may surround the substrate holders 20 and the showerheads 30. The chamber 10 may include, for example, a slit valve 12, a plurality of stations 14, and a viewport 16. The substrate W may be provided through the slit valve 12 into one of the stations 14 of the chamber 10. The stations 14 may be defined by a partition wall 18 in the chamber 10. The chamber 10 may have, for example, four stations 14. The showerheads 30 may be disposed in corresponding stations 14. The viewport 16 may externally expose the substrate holder 20 and the showerheads 30 in the chamber 10.

The substrate holder 20 may be disposed in each of the stations 14 of the chamber 10. The substrate holder 20 may receive the substrate W. The substrate holder 20 may include a susceptor. The substrate holder 20 may support an edge of the substrate W. The substrate holder 20 may downwardly expose a center of the substrate W.

A showerhead 30 may be disposed in each of the stations 14 of the chamber 10. The showerheads 30 may each include, for example, upper showerheads 32 and lower showerheads 34. The upper showerhead 32 and the lower showerhead 34 may be disposed respectively above and below the substrate holder 20.

The upper showerhead 32 may be disposed above the substrate holder 20. The upper showerhead 32 may be disposed above the substrate W. A carrier gas supply 40 may be connected to the upper showerheads 32. The carrier gas supply 40 may supply the upper showerheads 32 with a carrier gas 42. The upper showerhead 32 may provide the carrier gas 42 to a top surface of the substrate W.

The lower showerhead 34 may be disposed below the upper showerhead 32 and the substrate holder 20. The lower showerhead 34 may be disposed below the substrate W. A pair of upper and lower showerheads 32 and 34 may be arranged in each of the stations 14. The upper showerheads 32 may be disposed to face corresponding lower showerhead 34. A reaction gas supply 50 may be connected to the lower showerheads 34. The reaction gas supply 50 may provide the lower showerheads 34 with a first reaction gas 52 and a second reaction gas 54. The first reaction gas 52 may include, for example, tetraethylorthosilicate (TEOS) and/or $O_2$, and the second reaction gas 54 may include, for example, silane ($SiH_4$) and/or ammonia ($NH_3$). In another implementation, the first reaction gas 52 and the second reaction gas 54 may be the same as each other. The lower showerhead 34 may use the first reaction gas 52 and the second reaction gas 54 to form a lower striped pattern (see 6 of FIG. 5) and a planar layer (see 8 of FIG. 15) on a bottom surface of the substrate W. A power supply 60 may be connected to the upper showerheads 32. The power supply 60 may provide the upper showerhead 32 with a radio frequency power 62 to induce a plasma reaction of the first reaction gas 52 and the second reaction gas 54. The plasma reaction may heat the substrate W. The substrate W may be heated to about 300° C., for example.

Figure 3:
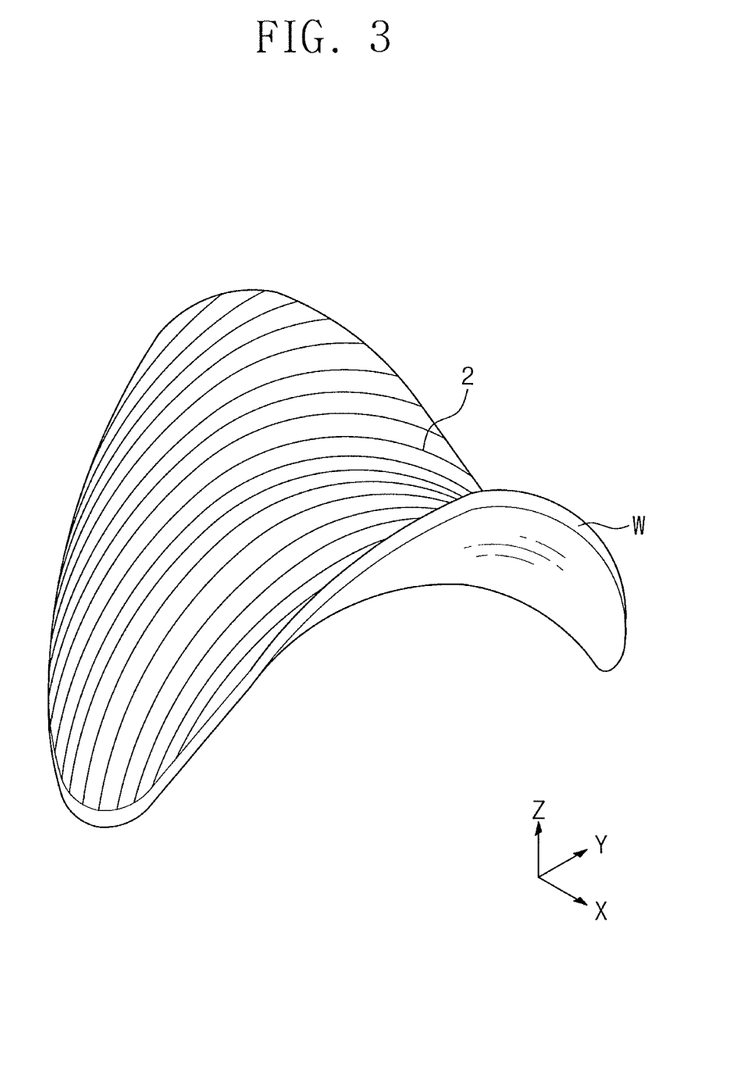
FIG. 3 illustrates a perspective view showing warpage of a substrate depicted in FIG. 2.

FIG. 3 shows warpage of the substrate W illustrated in FIG. 2.

Referring to FIG. 3, the heated substrate W may be bent or warped. For example, the bent substrate W may have a saddle shape when heated. Alternatively, the substrate W may be bent into a saddle shape at room temperature (e.g., 20° C.). The substrate W may include a silicon wafer. The substrate W may be, for example, a silicon wafer having a semiconductor device (e.g., 3D NAND Flash memory) formed thereon. The substrate W may have, for example, an upper pattern 2 of a semiconductor device. The upper pattern 2 may include a metal pattern of a word line. The upper pattern 2 may extend in a second direction Y. The substrate W may have therebetween a different coefficient of thermal expansion relative to the upper pattern 2. When the substrate W is changed in temperature, the substrate W may be bent due to a difference in coefficient of thermal expansion between the substrate W and the upper pattern 2.

Referring back to FIGS. 1 and 2, the lower showerhead 34 may provide the bent substrate W with the first reaction gas 52 and the second reaction gas 54 to form a lower striped pattern (see 6 of FIG. 5) and a planar layer (see 8 of FIG. 15) on the bent substrate W, which may help to planarize or unbend the substrate W.

Figure 4:
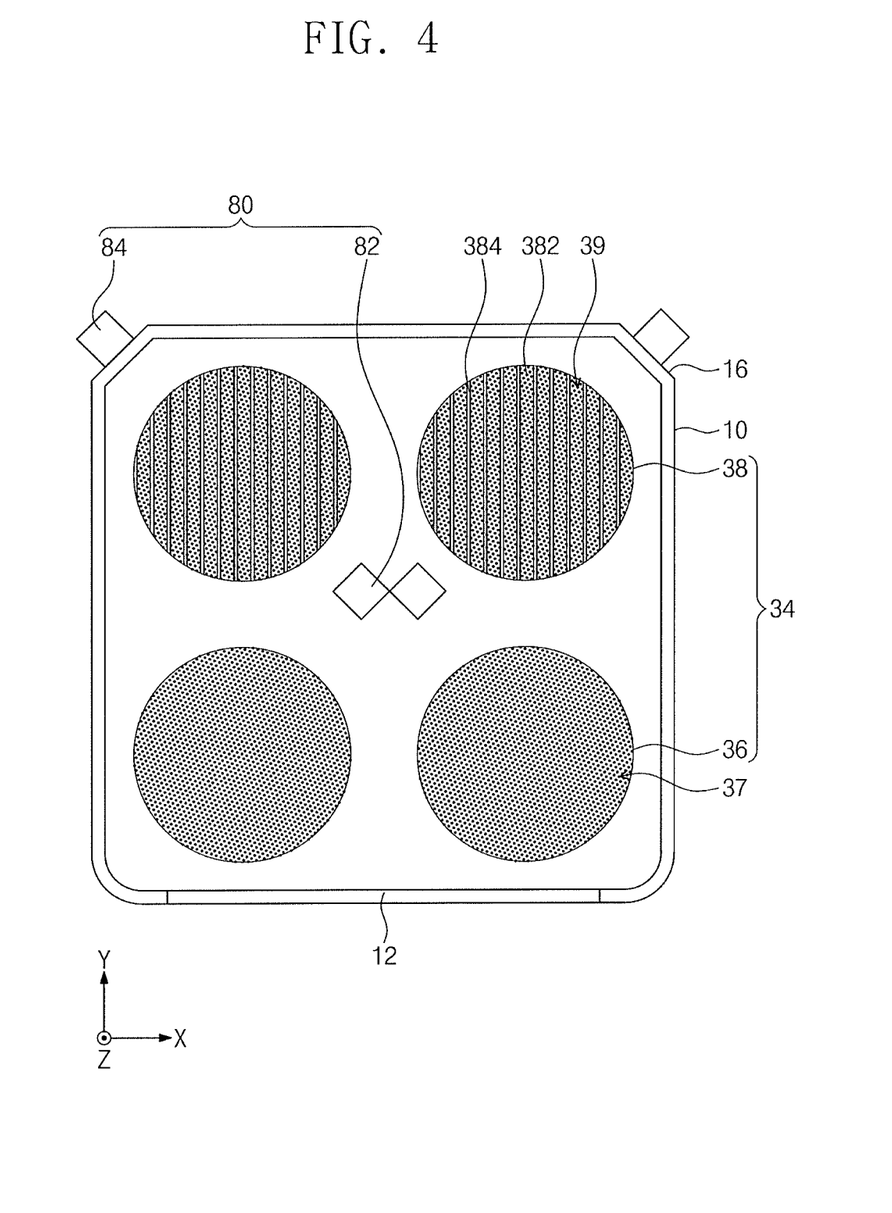
FIG. 4 illustrates a plan view of example of showerheads depicted in FIG. 1.

FIG. 4 shows an example of the lower showerheads 34 illustrated in FIG. 2.

Referring to FIG. 4, the lower showerheads 34 may include an isotropic showerhead 36 and a striped showerhead 38. For example, the lower showerhead 34 may be one of the isotropic showerhead 36 and the striped showerhead 38.

The isotropic showerhead 36 may be disposed adjacent to the slit valve 12. As shown in FIG. 4, the isotropic showerhead 36 may be disposed between the slit valve 12 and the striped showerhead 38 in the second direction Y. The isotropic showerhead 36 may have first nozzle holes 37. The first nozzle holes 37 may be isotropically disposed on a top surface of the isotropic showerhead 36. The first reaction gas supply 56 may be connected to the isotropic showerheads 36. The first reaction gas supply 56 may supply the isotropic showerhead 36 with the first reaction gas 52.

The striped showerhead 38 may be disposed between the isotropic showerhead 36 and the viewport 16. The striped showerhead 38 may have second nozzle holes 39. The second nozzle holes 39 may be non-isotropically arranged on a top surface of the striped showerhead 38. For example, the second nozzle holes 39 may be arranged in a striped shape. The second reaction gas supply 58 may be connected to the striped showerheads 38. The second reaction gas supply 58 may provide the striped showerhead 38 with the second reaction gas 54. The striped showerhead 38 may have, for example, first striped nozzle regions 382 and first striped blank regions 384. The first striped nozzle regions 382 may be areas that have the second nozzle holes 39, and the first striped blank regions 384 may be areas that do not have nozzle holes. In this configuration, the first striped nozzle regions 382 may provide the second reaction gas 54 to the substrate W. The first striped blank regions 384 may not provide any reaction gas. The first striped nozzle regions 382 and the first striped blank regions 384 may extend, for example, in the second direction Y.

Figure 5:
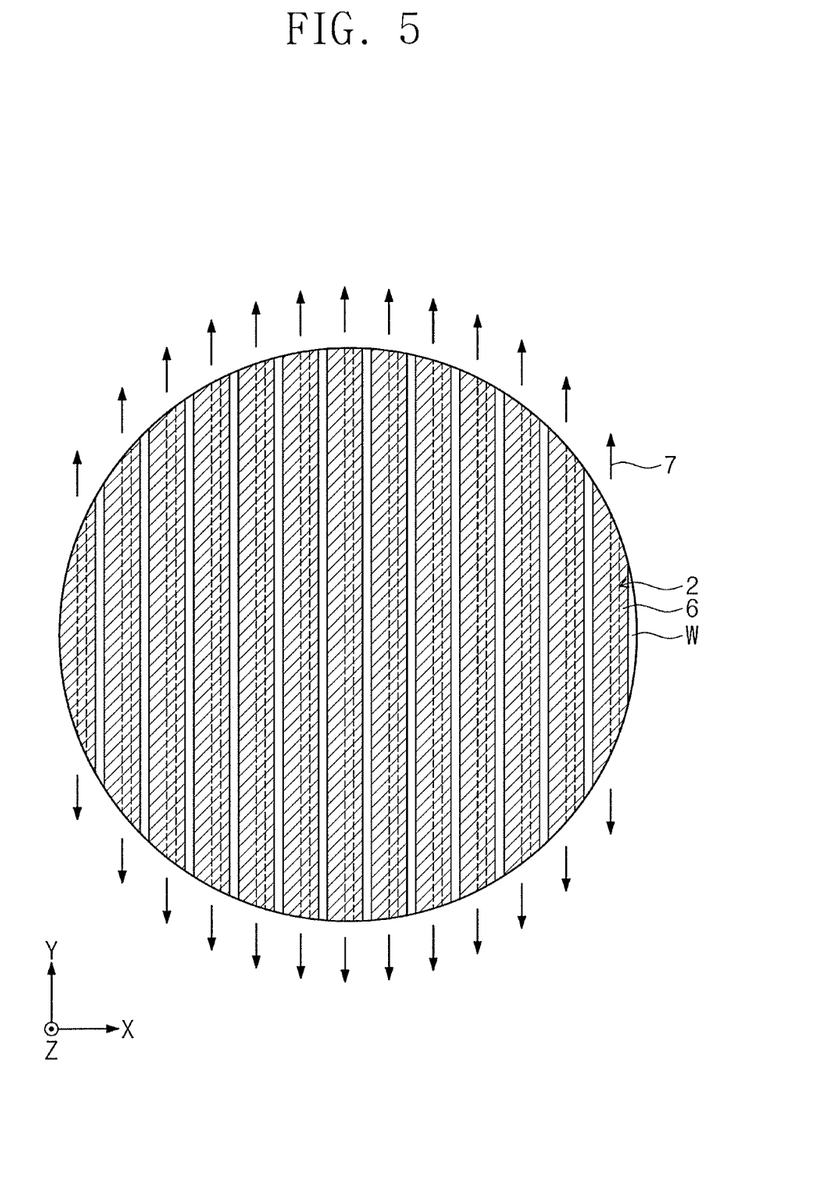
FIG. 5 illustrates a plan view showing a lower striped pattern formed by a striped showerhead depicted in FIG. 4.

FIG. 5 shows the substrate W on which a lower striped pattern 6 is formed by the striped showerhead 38 depicted in FIG. 4.

Referring to FIGS. 2 to 5, the striped showerhead 38 may provide the second reaction gas 54 along the first striped nozzle regions 382 to form the lower striped pattern 6 on the substrate W. The lower striped pattern 6 may have the same shape as that of the first striped nozzle region 382. For example, the lower striped pattern 6 may extend in parallel or in the same direction as that in which the upper pattern 2 extends. For example, the lower striped pattern 6 may extend in the second direction Y. The lower striped pattern 6 may expose a portion of the surface of the substrate W.

The lower striped pattern 6 may provide the bent substrate W with a tensile force (indicated by arrows 7) oriented in a direction that is predetermined to planarize the substrate W. The lower striped pattern 6 with the tensile force 7 may help to flatten or planarize the substrate W whose edge is bent downwardly more than a center thereof. Alternatively, the lower striped pattern 6 may provide the bent substrate W with a compressive force (indicated by arrows 9 of FIG. 9, which is discussed in detail below) to planarize the substrate W. The lower striped pattern 6 with the compressive force 9 may planarize the bent substrate W whose edge is bent upwardly more than the center thereof.

Figure 6:
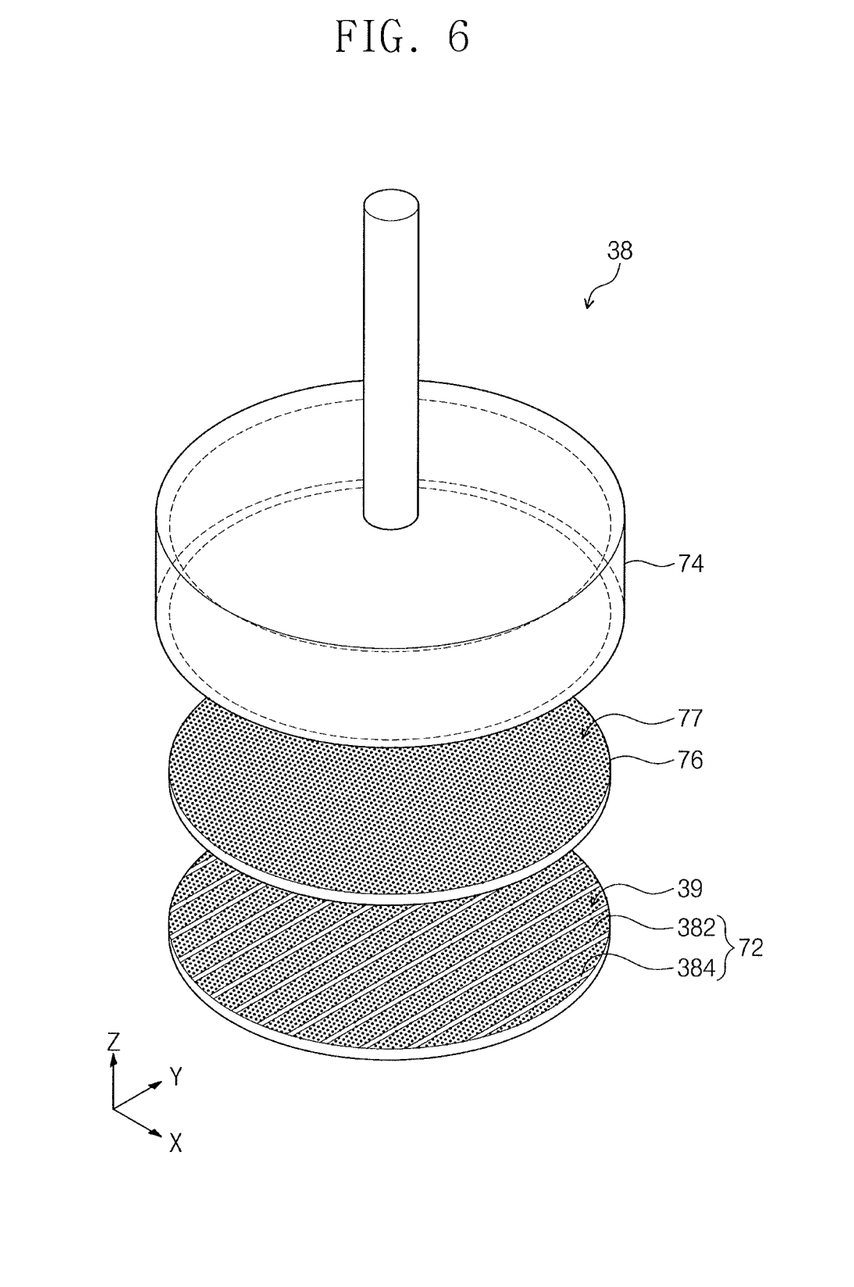
FIG. 6 illustrates an exploded perspective view of a striped showerhead depicted in FIG. 4.

FIG. 6 shows an example of the striped showerhead 38 illustrated in FIG. 4.

Referring to FIG. 6, the striped showerhead 38 may include a nozzle plate 72, a cover housing 74, and a blocker plate 76.

The nozzle plate 72 may be disposed below the cover housing 74 and the blocker plate 76. Alternatively, the nozzle plate 72 may be disposed above the cover housing 74 and the blocker plate 76. The nozzle plates 72 may have, for example, a disc shape.

Figure 7:
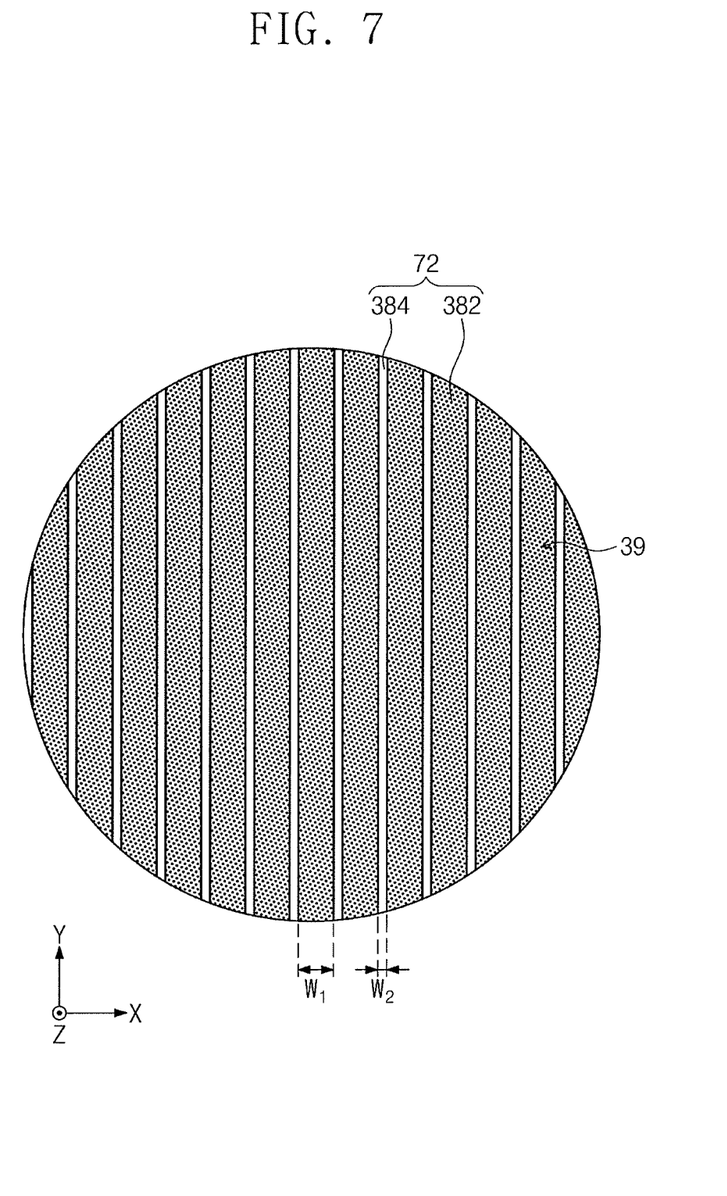
FIG. 7 illustrates a plan view of a nozzle plate depicted in FIG. 6.

FIG. 7 shows an example of the nozzle plate 72 illustrated in FIG. 6.

Referring to FIGS. 6 and 7, the nozzle plate 72 may include first striped nozzle regions 382 and first striped blank regions 384 between the first striped nozzle regions 382. For example, the first striped nozzle regions 382 and the first striped blank regions 384 may extend linearly in the second direction Y from one side edge of the nozzle plate 72 to other side edge of the nozzle plate 72.

The first striped nozzle regions 382 may have second nozzle holes 39. The first striped nozzle regions 382 may be spaced apart at a regular interval in a first direction X and may extend in the second direction Y. For example, each of the first striped nozzle regions 382 may have a first width W1 equal to or greater than about 1 µm. For example, the first width W1 of each of the first striped nozzle regions 382 may be about 3.4 µm.

The first striped blank regions 384 and the first striped nozzle regions 382 may be disposed alternately in the first direction X. The first striped blank regions 384 may have a similar shape to that of the first striped nozzle regions 382. In an example embodiment, the first striped blank region 384 may be about 10 times narrower than, i.e., about 1/10th the width of, the first striped nozzle region 382. For example, each of the first striped blank regions 384 may have a second width W2 equal to or less than about 1 µm. The first width W1 of each of the first striped nozzle regions 382 may be about 10 times greater than the second width W2 of each of the first striped blank regions 384. For example, when each of the first striped nozzle regions 382 has the first width W1 of about 3.4 µm, each of the first striped blank regions 384 may have the second width W2 of about 0.34 µm.

Referring again to FIG. 6, the cover housing 74 may be disposed on the nozzle plate 72. The cover housing 74 may have a cup shape, for example. The nozzle plate 72 may be provided in the cover housing 74. The cover housing 74 may surround top and lateral surfaces of the nozzle plate 72. The nozzle plate 72 may have a bottom surface exposed from, or at least partially not covered by, the cover housing 74. The second reaction gas 54 may fill the cover housing 74 on the nozzle plate 72, and may then be provided through the second nozzle holes 39 to the substrate W.

The blocker plate 76 may be disposed in the cover housing 74 on the nozzle plate 72. The blocker plate 76 may buffer pressure of the second reaction gas 54 and may mix the second reaction gas 54. The blocker plate 76 may have inner holes 77. The second reaction gas 54 may be provided through the inner holes 77 to the second nozzle holes 39.

Referring again to FIG. 2, a substrate warpage detector 80 may be disposed inside and outside the chamber 10. The substrate warpage detector 80 may optically detect warpage of the substrate W. The substrate warpage detector 80 may include, for example, a laser 82 (or optical source) and an optical sensor 84. The laser 82 may be disposed on a center of the chamber 10. For example, the laser 82 may be placed in the partition wall 18. The laser 82 may generate a laser beam 86 and provide the optical sensor 84 with the laser beam 86. The optical sensor 84 may be disposed outside the chamber 10. For example, the optical sensor 84 may be placed in the viewport 16. The optical sensor 84 may detect the laser beam 86 to determine warpage of the substrate W. The laser beam 86 may be provided horizontally to the substrate holder 20 and the striped showerhead 38. When the substrate W is bent, the substrate W may block the laser beam 86. When the laser beam 86 is blocked, the optical sensor 84 may not receive the laser beam 86. When the optical sensor 84 does not receive the laser beam 86, a controller (not shown) may determine that the substrate W is bent.

When the substrate W is flat, the laser beam 86 may be provided to the optical sensor 84. The optical sensor 84 may receive the laser beam 86 and may determine that the substrate W is flat. The substrate holder 20 may rotate the substrate W at an azimuthal angle, e.g., while the laser beam 86 is provided.

Although not shown, a robot arm (e.g., spindle) may be provided in the center of the chamber 10. The robot arm may be disposed above and/or below the laser 82. The robot arm may transfer the substrate W onto the substrate holder 20.

Figure 8:
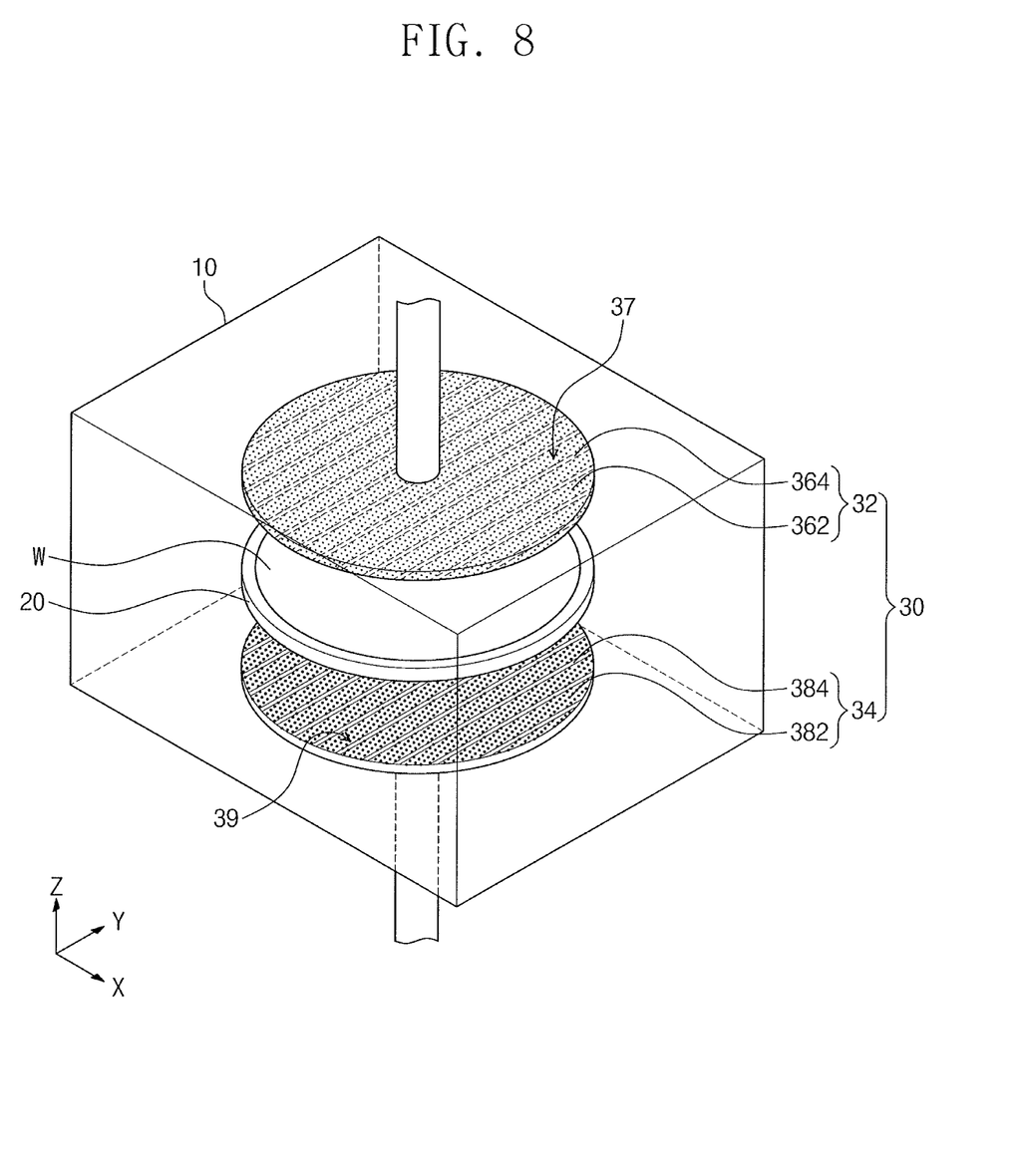
FIG. 8 illustrates a perspective view of a semiconductor manufacturing apparatus according to an example embodiment.

FIG. 8 shows an example of the semiconductor manufacturing apparatus 100 according to an example embodiment.

Referring to FIG. 8, the upper showerhead 32 of the semiconductor manufacturing apparatus 100 may have second striped nozzle regions 362 and second striped blank regions 364. The second striped nozzle regions 362 may have first nozzle holes 37. The first nozzle holes 37 may provide the first reaction gas 52 to the top surface of the substrate W. Each of the second striped blank regions 364 may be disposed between the second striped nozzle regions 362. The second striped blank regions 364 may have a similar shape to that of the second striped nozzle regions 362. The second striped blank regions 364 may be narrower than the second striped nozzle regions 362. The first striped nozzle regions 382 and the first striped blank regions 384 of the lower showerhead 34 may extend in the same direction as an extending direction of the second striped nozzle regions 362 and the second striped blank regions 364 of the upper showerhead 32.

The chamber 10 and the substrate holder 20 may be configured identically to those discussed in FIGS. 1 and 2.

Figure 9:
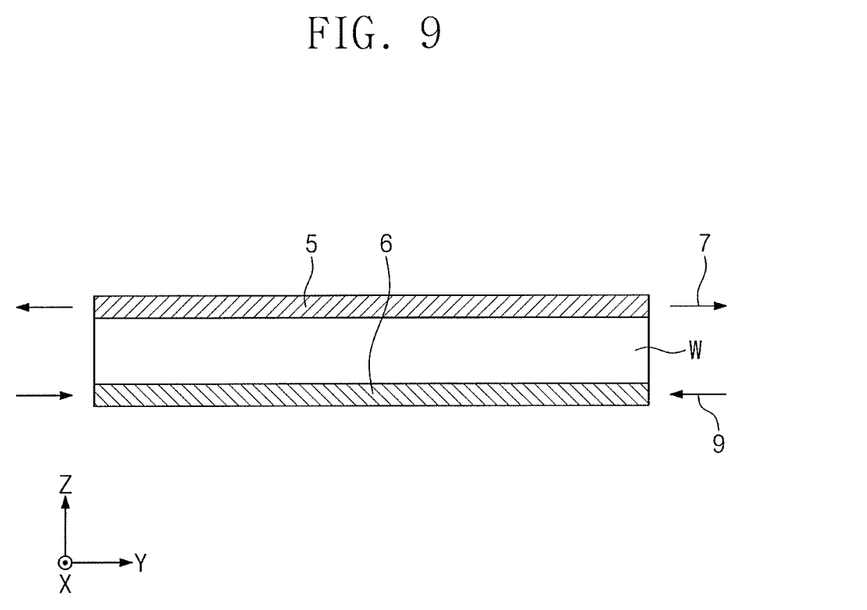
FIG. 9 illustrates a cross-sectional view of upper and lower striped patterns formed by upper and lower showerheads depicted in FIG. 8.

FIG. 9 shows an example of an upper striped pattern 5 and a lower striped pattern 6 which are formed by the upper showerhead 32 and the lower showerhead 34 of FIG. 8.

Referring to FIGS. 8 and 9, the upper showerhead 32 and the lower showerhead 34 may respectively form the upper striped pattern 5 and the lower striped pattern 6 on the substrate W. The lower striped pattern 6 may be formed on the bottom surface of the substrate W, and the upper striped pattern 5 may be formed on the top surface of the substrate W. The upper striped pattern 5 and the lower striped pattern 6 may extend in the same direction. The upper striped pattern 5 and the lower striped pattern 6 may use different forces to planarize the substrate W. For example, when the upper striped pattern 5 has a tensile force 7, the lower striped pattern 6 may have a compressive force 9. The upper striped pattern 5 and the lower striped pattern 6 may be made of different materials from each other. The upper striped pattern 5 may include, for example, silicon nitride, and the lower striped pattern 6 may include, for example, silicon oxide.

Figure 10:
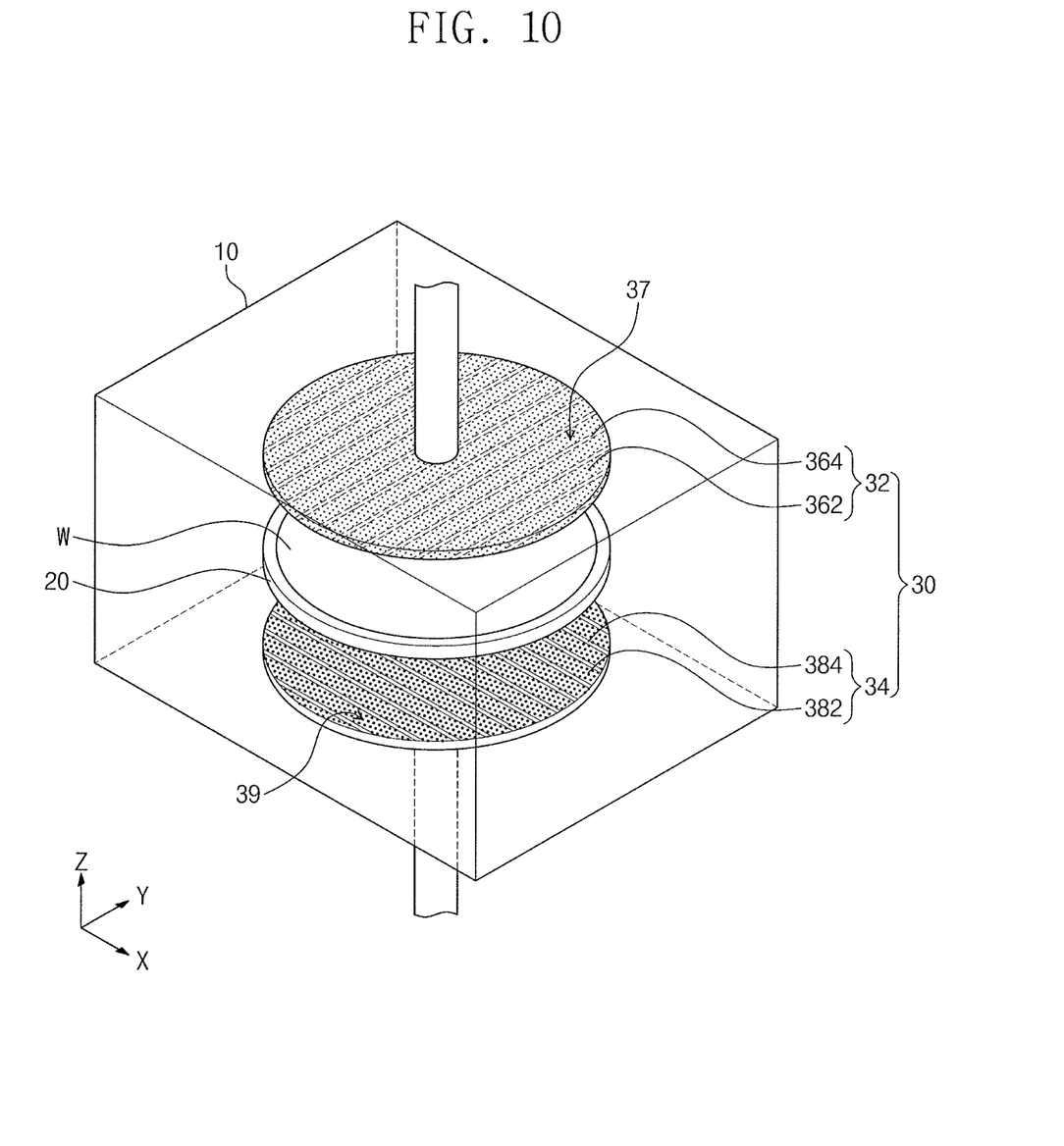
FIG. 10 illustrates a perspective view of a semiconductor manufacturing apparatus according to an example embodiment.

FIG. 10 shows an example of the semiconductor manufacturing apparatus 100 according to an example embodiment.

Referring to FIG. 10, the second striped nozzle regions 362 of the upper showerhead 32 may be arranged in a direction that intersects an extending direction of the first striped nozzle regions 382 of the lower showerhead 34. For example, the second striped nozzle regions 362 may have a longitudinal direction perpendicular to that of the first striped nozzle regions 382. The second striped nozzle regions 362 may be arranged in the first direction X, and the first striped nozzle regions 382 may be arranged in the second direction Y. The chamber 10 and the substrate holder 20 may be configured identically to those discussed in FIGS. 1 and 2.

Figure 11:
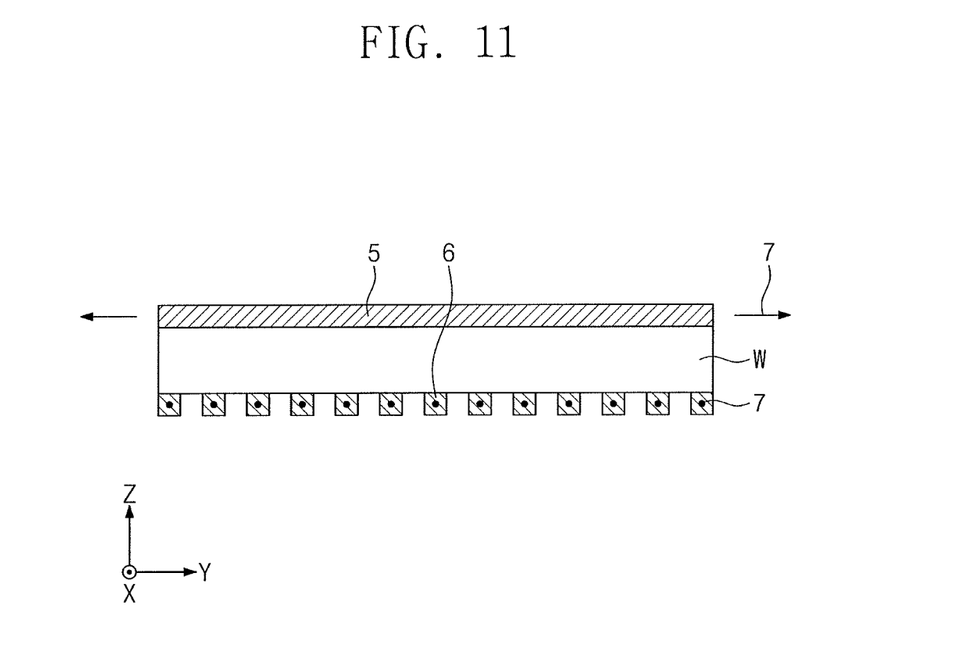
FIG. 11 illustrates a cross-sectional view of example of upper and lower striped patterns formed by upper and lower showerheads depicted in FIG. 10.

FIG. 11 shows an example of the upper striped pattern 5 and the lower striped pattern 6 that are formed by the upper showerhead 32 and the lower showerhead 34 of FIG. 10.

Referring to FIGS. 10 and 11, the second striped nozzle regions 362 may form the upper striped pattern 5 that extends in the first direction X on the top surface of the substrate W, and the first striped nozzle regions 382 may form the lower striped pattern 6 that extends in the second direction Y on the bottom surface of the substrate W. The upper striped pattern 5 and the lower striped pattern 6 may use the same force to remove warpage of the substrate W. For example, the upper striped pattern 5 and the lower striped pattern 6 may have their tensile force 7 to planarize the substrate W. Alternatively, the upper striped pattern 5 and the lower striped pattern 6 may have their compressive force 9.

The following describes a semiconductor manufacturing method using the semiconductor manufacturing apparatus 100 described above.

Figure 12:
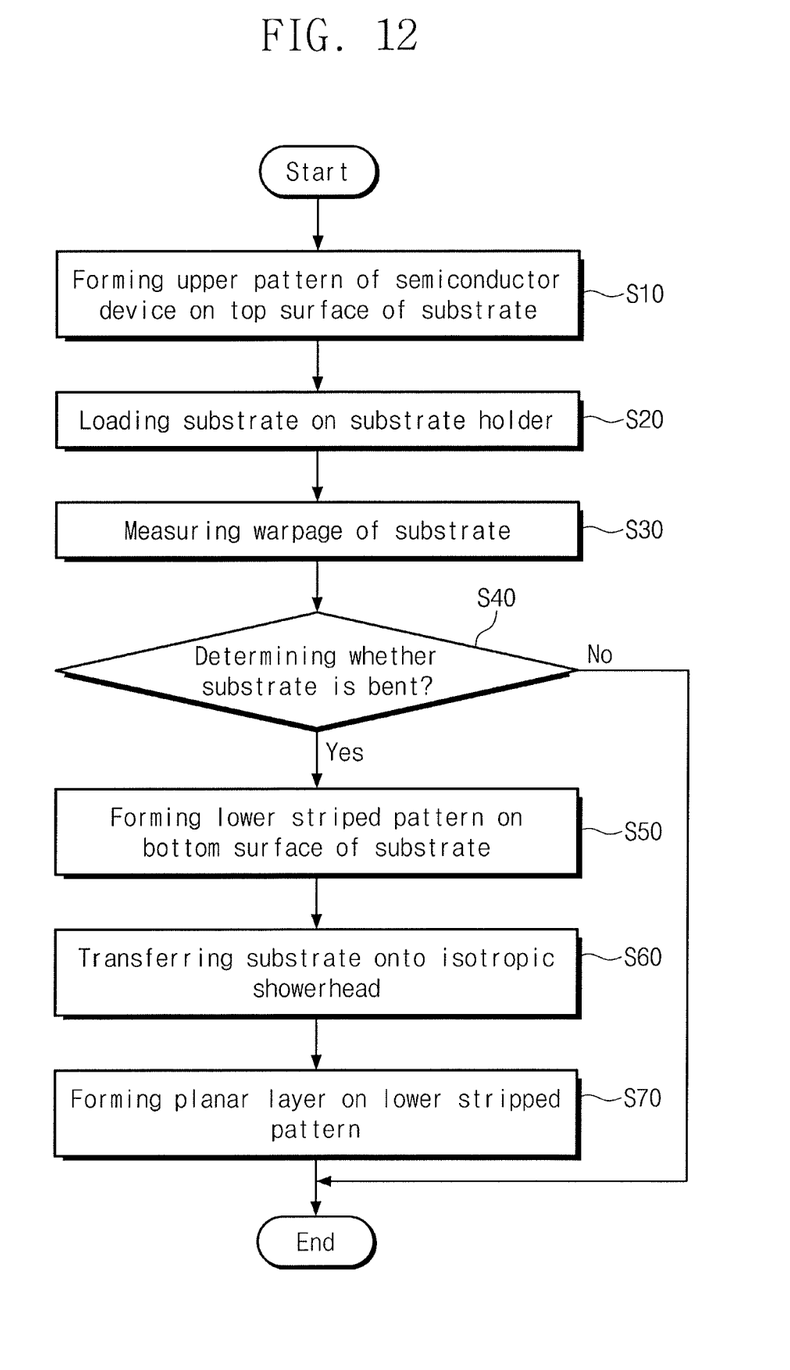
FIG. 12 illustrates a flow chart showing a semiconductor manufacturing method according to an example embodiment.
Figure 13:
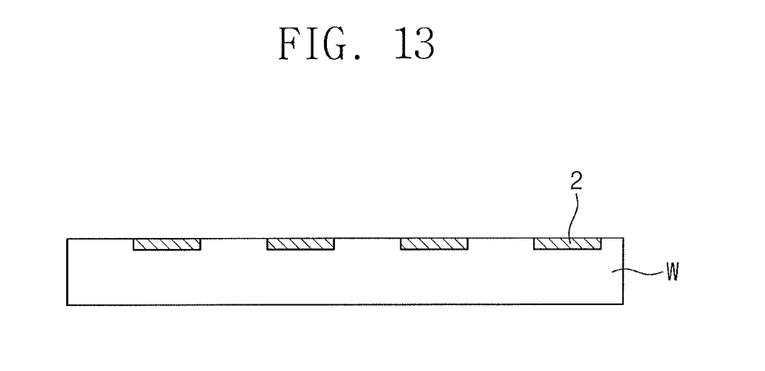
FIGS. 13, 14, and 15 illustrate cross-sectional views showing processes performed on a substrate depicted in FIG. 2.
Figure 14:
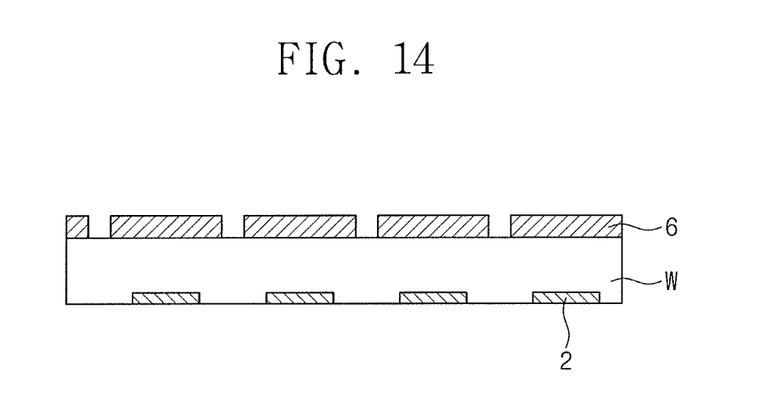
Figure 15:
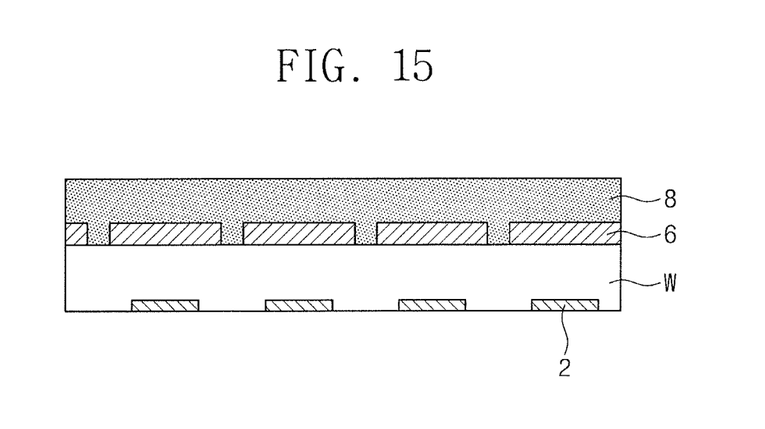

FIG. 12 shows a semiconductor manufacturing method according to an example embodiment. FIGS. 13 to 15 are cross-sectional views showing processes performed on the substrate W of FIG. 2.

Referring to FIGS. 12 and 13, unit process apparatuses (not shown) may form, on the top surface of the substrate W, an upper pattern 2 of a semiconductor device (S10). The semiconductor device may include, for example, a 3D NAND Flash memory device. The semiconductor device may be fabricated through a plurality of unit processes, such as deposition, photolithography, etching, and cleaning. The upper pattern 2 may serve as a word line of the semiconductor device.

Referring to FIGS. 1, 2, and 12, an interface apparatus (not shown) may receive the substrate W on the substrate holder 20 and the striped showerhead 38 (S20). The substrate W may be provided through the slit valve 12 to the substrate holder 20. The substrate holder 20 may contact an edge of the bottom surface of the substrate W.

The substrate warpage detector 80 may measure warpage of the substrate W (S30). The laser 82 of the substrate warpage detector 80 may provide the optical sensor 84 with the laser beam 86. The substrate holder 20 may rotate the substrate W at an azimuthal angle. When the substrate W is bent, the laser beam 86 may be blocked and the optical sensor 84 may not receive the laser beam 86. When the substrate W is flat, the laser beam 86 may be provided to the optical sensor 84 and the optical sensor 84 may receive the laser beam 86.

A controller (not shown) may use a detection signal to determine whether or not the substrate W is bent (S40). When the optical sensor 84 does not receive the laser beam 86, the controller may determine that the substrate W is bent. When the optical sensor 84 receives the laser beam 86, the controller may determine that the substrate W is flat. When it is determined that the substrate W is flat, the interface apparatus may unload the substrate W from the chamber 10.

Referring to FIGS. 1, 12, and 14, when it is determined that the substrate W is bent, the second reaction gas supply 58 may provide the first striped nozzle region 382 with the second reaction gas 54 to form a lower striped pattern 6 on the bottom surface of the substrate W (S50). The lower striped pattern 6 may use a tensile force 7 or a compressive force 9 to planarize the substrate W. When an edge of the substrate W is bent downwardly more than a center thereof, the lower striped pattern 6 may be formed to have the tensile force 7. When the edge of the substrate W is bent upwardly more than the center of the substrate W, the lower striped pattern 6 may be formed to have the compressive force 9. The lower striped pattern 6 may include, for example, silicon nitride or silicon oxide. Silicon nitride may provide the substrate W with the tensile force 7, and silicon oxide may provide the substrate W with the compressive force 9. Alternatively, silicon nitride may provide the substrate W with the compressive force 9.

Figure 16:
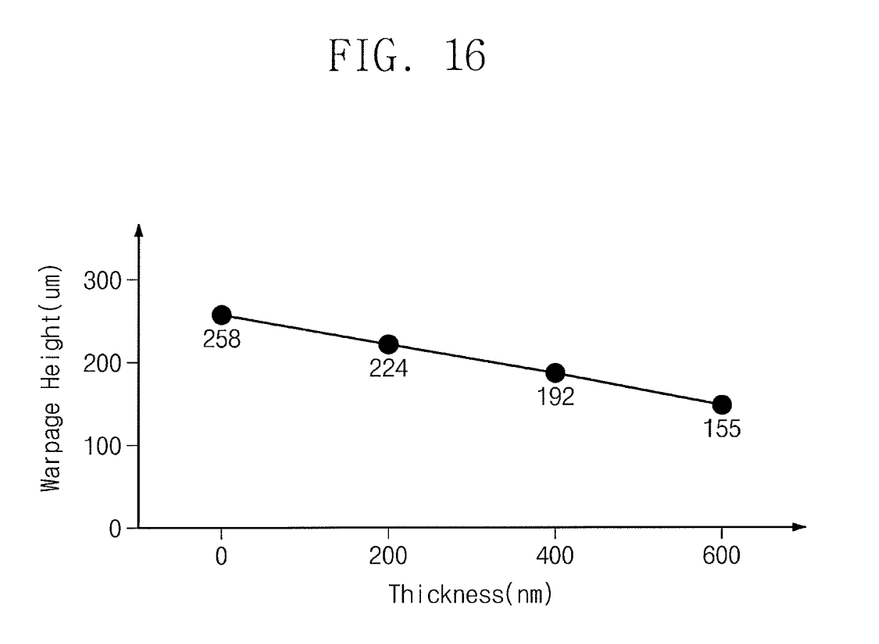
FIG. 16 illustrates a graph showing a reduction in warpage height of a substrate versus thickness of the lower striped pattern depicted in FIG. 5.

FIG. 16 shows a reduction in warpage height of the substrate W versus thickness of the lower striped pattern 6.

Referring to FIG. 16, the greater thickness of the lower striped pattern 6, the lower warpage height of the substrate W. For example, the lower striped pattern 6 may planarize the bent substrate W, and the thickness of the lower striped pattern 6 may be inversely proportional to a difference in height between the center and the edge of the bent substrate W. When the edge of the substrate W is upwardly bent to a height about 100 μm greater than that of the center of the substrate W, the lower striped pattern 6 may be formed to have a thickness of about 600 nm and the substrate W may thus become planarized. The lower striped pattern 6 may include silicon nitride, and may have a width of about 3.4 μm and a spacing of about 0.34 μm from a neighboring lower striped pattern 6. For example, the edge of the substrate W may be bent to a height about 258 μm higher than that of the center of the substrate W. The height of the edge of the substrate W may decrease when the lower striped pattern 6 increases in thickness. When the thickness of the lower striped pattern 6 is about 200 nm, the edge of the substrate W may have a height about 224 μm greater than that of the center of the substrate W. The edge of the substrate W may become lowered as much as about 34 nm. When the thickness of the lower striped pattern 6 is about 400 nm, the edge of the substrate W may have a height about 192 μm greater than that of the center of the substrate W. The edge of the substrate W may become lowered again as much as about 32 nm. When the thickness of the lower striped pattern 6 is about 600 nm, the edge of the substrate W may have a height about 155 μm greater than that of the center of the substrate W. The edge of the substrate W may become lowered again as much as about 37 nm. Consequently, the lower striped pattern 6 with the thickness of about 600 nm may planarize the substrate W which is bent to a height of about 100 μm.

Referring to FIG. 4, a robot arm (e.g., spindle) may transfer the substrate W onto the isotropic showerhead 36 (S60). The substrate W may be cooled to room temperature (e.g., about 20° C.). The cooled substrate W may be flat.

Referring to FIGS. 1, 12, and 15, the first reaction gas supply 56 may provide the isotropic showerhead 36 with the first reaction gas 52 to form a planar layer 8 on the lower striped pattern 6 (S70). The planar layer 8 may include a different material from that of the lower striped pattern 6. When the lower striped pattern 6 includes silicon nitride, the planar layer 8 may include silicon oxide. When the lower striped pattern 6 includes silicon oxide, the planar layer 8 may include silicon nitride.

In addition, the power supply 60 may provide the upper showerheads 32 with the radio frequency power 62 without supplying the first reaction gas 52 and the second reaction gas 54, and thus the planar layer 8 may become further planarized.

As described above, embodiments are directed to an apparatus for, and a method of, manufacturing a semiconductor device As described above, a semiconductor manufacturing apparatus according to an embodiment may use a striped showerhead to form a lower striped pattern on a bent substrate, and as a result, the bent substrate may be planarized.

Embodiments may provide a showerhead for planarizing bent substrates, a semiconductor manufacturing apparatus including the same, and a semiconductor manufacturing method.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor manufacturing apparatus, comprising:
a chamber that includes first and second station;
a first substrate holder in the first station;
a second substrate holder in the second station, each of the first and second substrate holders receiving a substrate; and
lower showerheads including:
an isotropic showerhead below the first substrate holder; and
a striped showerhead below the second substrate holder,
wherein the isotropic showerhead has first holes that isotropically provide a first reaction gas on a bottom surface of the substrate,
wherein the striped showerhead has striped nozzle regions and striped blank regions between the striped nozzle regions, the striped nozzle regions having second holes that non-isotropically provide a second reaction gas on the bottom surface of the substrate,
wherein the striped nozzle regions and the striped blank regions extend entirely in continuous straight lines from one side to an opposite side of the striped showerhead, and
wherein the striped nozzle regions are parallel to each other.

2. The apparatus as claimed in claim 1, wherein the striped nozzle regions each have a shape similar to a shape of the striped blank regions.

3. The apparatus as claimed in claim 1, wherein the striped nozzle regions are each wider than the striped blank regions.

4. The apparatus as claimed in claim 3, wherein the striped blank regions each have a width that is equal to or less than 1 μm, and the striped nozzle regions are each wider than the striped blank regions.

5. The apparatus as claimed in claim 3, wherein the striped nozzle regions each have a width that is 10 times greater than a width of the striped blank regions.

6. The apparatus as claimed in claim 5, wherein
the width of each of the striped nozzle regions is 3.4 μm, and
the width of each of the striped blank regions is 0.34 μm.

7. The apparatus as claimed in claim 1, wherein the chamber further includes a slit valve through which the substrate is provided, and the isotropic showerhead is between the slit valve and the striped showerhead.

8. The apparatus as claimed in claim 1, further comprising an upper showerhead that is above the substrate holder and the lower showerheads, the upper showerhead providing a carrier gas on a top surface of the substrate.

9. The apparatus as claimed in claim 1, further comprising a substrate warpage detector that is on a sidewall of the chamber and detects warpage of the substrate on the substrate holder.

10. The apparatus as claimed in claim 9, wherein:
the chamber further includes a viewport adjacent to the striped showerhead, and the substrate warpage detector includes:
an optical source that generates a laser beam; and
an optical sensor that is spaced apart from the optical source and receives the laser beam to determine the warpage of the substrate.

11. A semiconductor manufacturing apparatus, comprising: a chamber; a substrate holder that is in the chamber and receives a substrate; a lower showerhead that is below the substrate holder and includes first striped nozzle regions; and an upper showerhead that is above the substrate holder and includes second striped nozzle regions that are the same as the first striped nozzle regions having holes to provide a reaction gas to a bottom surface of the substrate; and an upper showerhead that is above the substrate holder and includes second striped nozzle regions that are the same as the first striped nozzle regions, wherein: the lower showerhead further includes striped blank regions between the first striped nozzle regions, and the striped blank regions extending entirely in continuous straight lines from one side to an opposite side of the lower showerhead, the first striped nozzle region being parallel to each other.

12. The apparatus as claimed in claim 11, wherein the first striped nozzle regions have a longitudinal direction that is parallel to a longitudinal direction of the second striped nozzle regions.

13. The apparatus as claimed in claim 11, wherein the first striped nozzle regions have a longitudinal direction that intersects a longitudinal direction of the second striped nozzle regions.

14. The apparatus as claimed in claim 11, wherein the striped blank regions have a shape that is the same as a shape of the first striped nozzle regions.

15. The apparatus as claimed in claim 11, wherein the upper showerhead further includes second striped blank regions that are between the second striped nozzle regions and have a shape that is the same as a shape of the second striped nozzle regions.

* * * * *